United States Patent
Cho et al.

(10) Patent No.: US 9,633,773 B2
(45) Date of Patent: Apr. 25, 2017

(54) THIN FILM COMMON MODE FILTER AND METHOD OF MANUFACTURING THE SAME

(71) Applicant: SAMSUNG ELECTRO-MECHANICS CO., LTD., Suwon-si, Gyeonggi-do (KR)

(72) Inventors: Jeong Min Cho, Suwon-si (KR); Won Chul Sim, Suwon-si (KR); Ho Jin Yun, Suwon-si (KR); Ju Hwan Yang, Suwon-si (KR); Young Seuck Yoo, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 18 days.

(21) Appl. No.: 14/223,598

(22) Filed: Mar. 24, 2014

(65) Prior Publication Data

US 2014/0285303 A1    Sep. 25, 2014

(30) Foreign Application Priority Data

Mar. 25, 2013 (KR) ........................ 10-2013-0031561

(51) Int. Cl.
| | |
|---|---|
| H01F 5/00 | (2006.01) |
| H01F 17/00 | (2006.01) |
| H01F 27/29 | (2006.01) |
| H03H 1/00 | (2006.01) |
| H03H 7/42 | (2006.01) |

(52) U.S. Cl.
CPC .......... *H01F 17/0013* (2013.01); *H01F 5/00* (2013.01); *H01F 27/292* (2013.01); *H01F 2017/0066* (2013.01); *H01F 2017/0093* (2013.01); *H03H 7/427* (2013.01); *H03H 2001/0057* (2013.01); *Y10T 29/4902* (2015.01)

(58) Field of Classification Search
CPC ........................ H01F 5/00; H01F 27/00–27/35
USPC ............ 336/65, 83, 200, 232, 192, 233–234
See application file for complete search history.

(56) References Cited

U.S. PATENT DOCUMENTS

| | | | |
|---|---|---|---|
| 6,262,513 B1 * | 7/2001 | Furukawa | ............... H01L 21/56 257/E21.502 |
| 2011/0007438 A1 * | 1/2011 | Ito | ....................... H01F 17/0006 361/56 |
| 2011/0007439 A1 * | 1/2011 | Asakawa | ............ H01F 17/0006 361/56 |

(Continued)

FOREIGN PATENT DOCUMENTS

| | | | |
|---|---|---|---|
| JP | 2000173824 A | * | 6/2000 |
| JP | 2012-084936 A | | 4/2012 |

(Continued)

*Primary Examiner* — Tuyen Nguyen
(74) *Attorney, Agent, or Firm* — McDermott Will & Emery LLP

(57) ABSTRACT

Disclosed herein are a thin film common mode filter and a method of manufacturing the same. The thin film common mode filter according to the exemplary embodiment of the present invention includes a magnetic substrate made of a magnetic ceramic material; and coil patterns formed on the magnetic substrate, wherein external electrodes connected with the coil patterns are sequentially stacked and insulating layers formed on and beneath the coil pattern are made of a composite of ferrite powder and thermosetting resin.

5 Claims, 4 Drawing Sheets

(56) References Cited

U.S. PATENT DOCUMENTS

2011/0291790 A1* 12/2011 Okumura ............ H01F 17/0013
　　　　　　　　　　　　　　　　　　　　　　　336/200

FOREIGN PATENT DOCUMENTS

KR　　　　2013017039 A　*　2/2013
WO　　WO2009104616 A　*　8/2009

* cited by examiner

100

100

THIN FILM COMMON MODE FILTER AND METHOD OF MANUFACTURING THE SAME

This application claims the benefit under 35 U.S.C. Section 119 of Korean Patent Application Serial No. 10-2013-0031561 entitled "Thin Film Common Mode Filter And Method Of Manufacturing The Same" filed on Mar. 25, 2013, which is hereby incorporated by reference in its entirety into this application.

BACKGROUND OF THE INVENTION

1. Technical Field

The present invention relates to a thin film common mode filter and a method of manufacturing the same, and a thin film common mode filter including an insulating layer made of a composite of ferrite powder and thermosetting resin and a method of manufacturing the same.

2. Description of the Related Art

As a technology development speed is accelerated, a resolution of electronic devices, such as a mobile phone, a digital TV, and the like, is gradually increased and a data amount transmitted between the electronic devices or within the electronic devices is gradually increased, such that a fast transmission environment, such as HDMI, DVI, MHL, USB 2.0, USB 3.0, and the like, is required.

These interfaces have adopted a differential signal system that uses a pair of signal lines to transmit differential signals (differential mode signals), unlike a single-end transmission system that has been generally used for a long time. However, high-speed digitalized electronic devices are sensitive to a stimulus from the outside.

That is, when small abnormal voltage and high frequency noise are introduced into an internal circuit of the electronic device from the outside, a circuit may be damaged or a signal may be distorted.

In order to prevent the circuit damage of the electronic device or the signal distortion from occurring, a filter is mounted to prevent the abnormal voltage and the high frequency noise from being introduced into the circuit. In general, a common mode filter has been used in a fast differential signal line, and the like, to remove a common mode noise.

The common mode noise is a noise occurring in the differential signal line and the common mode filter removes noise that may not be removed by the existing EMI filter. The common mode filter contributes to the improvement of EMC characteristics, such as home appliances, and the like or improvement in antenna characteristics, such as a mobile phone, and the like.

As a frequency of a signal between home appliances is increased, the use of a filter for removing the common mode noise has been inevitably increased.

Further, as a demand for the small and multi-functional electronic devices is increased, the common mode filter also uses a thin film technology to implement high impedance at the same size.

In general, the common mode filter has a structure in which a primary metal internal coil and a secondary metal internal coil that are enclosed with an insulating resin material are each formed on a body substrate, that is a ferrite sintered body, in a spiral shape and both ends of each coil are connected with external electrode terminals.

In this case, the primary and secondary internal coils are each inter-layer-insulated with the same or similar as or to the insulating resin material to prevent a magnetic flux from being leaked to a side of the common mode filter and concentrate a magnetic flux on a core of the common mode filter.

In the related art, an insulating layer insulating between coil layers is formed on the ferrite substrate by using only the thermosetting resin to obtain an effect of offsetting a magnetic flux within the common mode filter. Therefore, the related art has a limitation in the increase in impedance capacity as a size of a common mode filter is reduced.

RELATED ART DOCUMENT

Patent Document (Patent Document 1) Japanese Patent Laid-Open Publication No. 2012-084936

SUMMARY OF THE INVENTION

The present invention proposes to solve the foregoing disadvantages and problems raised by the thin film common mode filter according to the related art. An object of the present invention is to provide a thin film common mode filter capable of increasing common mode impedance by forming an insulating layer formed between a primary coil electrode and a secondary coil electrode with a composite of ferrite powder and thermosetting resin and a method of manufacturing the same.

According to an exemplary embodiment of the present invention, there is provided a thin film common mode filter, including: a magnetic substrate made of a magnetic ceramic material; and coil patterns formed on the magnetic substrate, wherein external electrodes connected with the coil patterns are sequentially stacked and insulating layers formed on and beneath the coil pattern are made of a composite of ferrite powder and thermosetting resin.

The coil pattern may be configured of a primary coil electrode and a secondary coil electrode that are electromagnetically coupled.

The external electrode may be formed in plural and may be connected to each end of the primary coil electrode and the secondary coil electrode one-to-one.

The insulating layer may form a passivation layer, a primary insulating layer, and a secondary insulating layer and at least one of the passivation layer, the primary insulating layer, and the secondary insulating layer may be made of a composite of the ferrite powder and the thermosetting resin.

The composite may be formed of the ferrite powder and the thermosetting resin having a ratio of 1:9 to 6:4.

According to another exemplary embodiment of the present invention, there is provided a method of manufacturing a thin film common mode filter, including: forming a passivation layer by printing an insulating material on a magnetic substrate that is partitioned into several regions, having a margin part M therebetween; forming a primary coil electrode on the passivation layer; forming a primary insulating layer by printing the insulating material on the primary coil electrode; forming a secondary coil electrode on the primary insulating layer; forming a secondary insulating layer by printing the insulating material on the secondary coil electrode; and forming an external electrode on the secondary insulating layer.

The forming of the secondary coil electrode may further include processing a via for conducting the secondary coil electrode and the primary coil electrode.

The forming of the external electrode may further include processing a via interconnecting the plurality of external electrodes corresponding to the primary coil electrode and the secondary coil electrode one-to-one.

The insulating material may be configured of a thermosetting resin or a composite of thermosetting resin or ferrite powder and any one of the passivation layer, the primary insulating layer, and the secondary insulating layer may be made of the composite of the ferrite powder and the thermosetting resin.

The method of manufacturing a thin film common mode filter may further include: cutting a region of the margin part M.

DESCRIPTION OF THE PREFERRED EMBODIMENTS

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Figure 1:
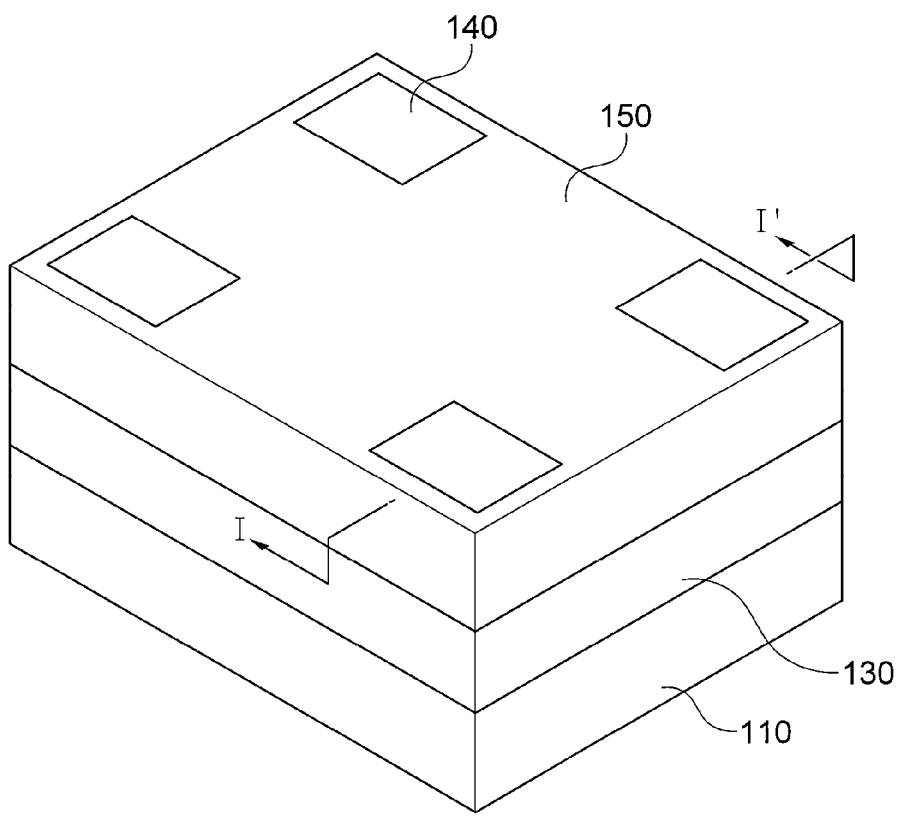
FIG. 1 is a perspective view of a thin film common mode filter according to an exemplary embodiment of present invention.
Figure 2:
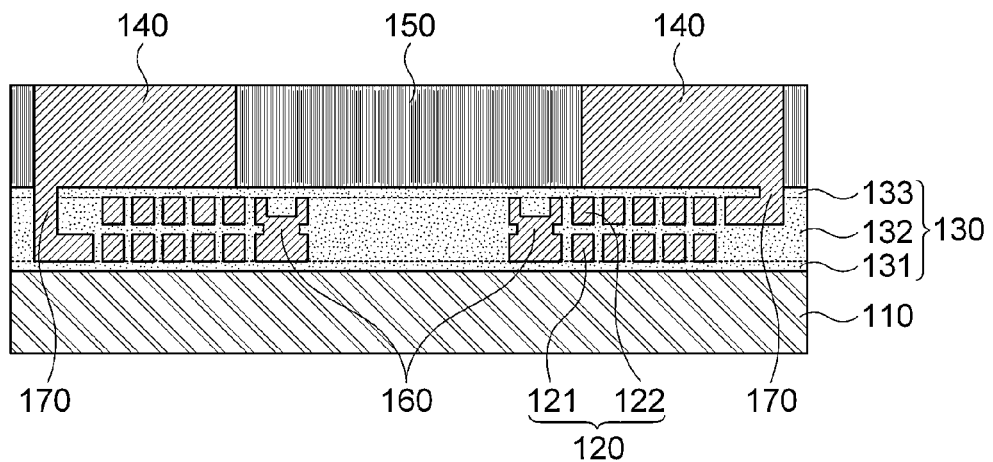
FIG. 2 is a cross-sectional view taken along the line I-I' of FIG. 1.

FIG. 1 is a perspective view of a thin film common mode filter according to an exemplary embodiment of present invention and FIG. 2 is a cross-sectional view taken along the line I-I' of FIG. 1. Additionally, components shown in the accompanying drawings are not necessarily shown to scale. For example, sizes of some components shown in the accompanying drawings may be exaggerated as compared with other components in order to assist in the understanding of the exemplary embodiments of the present invention. Meanwhile, throughout the accompanying drawings, the same reference numerals will be used to describe the same components. For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure.

Referring to FIGS. 1 and 2, a thin film common mode filter 100 according to the exemplary embodiment of the present invention may include a magnetic substrate 110 made of a magnetic ceramic material, a coil pattern 120, and a body element, in which an insulating layer 130 may be formed on and beneath the coil pattern 120.

The magnetic substrate 110 may be a base for manufacturing the thin film common mode filter 100. The magnetic substrate 110 may be made of a magnetic ceramic material.

The coil pattern 120 may have a multilayer structure. For example, the coil pattern 120 is an electrode that is plated on a plane thereof in a coil form and the coil pattern 120 for forming an electromagnetic coupling may have a coil form of one multilayer structure configured of a primary coil electrode 121 and a secondary coil electrode 122.

In order to increase permeability and impedance characteristic of the thin film common mode filter 100, the magnetic layer 150 may be formed by filling predetermined filler on a secondary insulating layer 133. In this case, the filler may be a resin composition containing a magnetic particle.

The magnetic substrate 100 and the magnetic layer 150 are a space through which a magnetic flux passes and in order to smooth a flow of magnetic flux, may be made of Ni—Zn-based, Mn—Zn-based, Ni—Zn-based, Ni—Zn—Mg-based, Mn—Mg—Zn-based ferrite having a high electric resistance and a small magnetic force loss or a mixture thereof.

As illustrated in FIG. 2, the coil patterns 120 may be vertically stacked to be spaced apart from each other at a predetermined distance, having the insulating layer 130 therebetween.

The coil pattern 120 may be manufactured by a method of leaving only a coil electrode by etching the remaining region except for a pattern forming region in which the coil pattern 120 is formed on the ferrite sheet in consideration of a pattern shape or the wound number of turns or is plated on the insulating layer 130.

The insulating layer 130 may prevent a short of the primary coil electrode 121 and the secondary coil electrode 122 forming the coil pattern 120 and prevent a crack phenomenon of an interface layer formed by an incomplete bonding of the insulating layer 130 and the coil pattern 120.

Further, the insulating layer 130 is a space through which a magnetic flux passes, such as the magnetic substrate 110 and the magnetic layer 150, to improve the common mode impedance while keeping the vertical flow of magnetic flux based on a center in the thin film common mode filter 100.

The insulating layer 130 is vertically formed on the coil pattern 120 and may be divided into a passivation layer 131 formed on the magnetic substrate 110, a primary insulating layer 132 formed on a primary coil, and a secondary insulating layer 133 formed on a secondary coil.

Further, the passivation layer 131, the primary insulating layer 132, and the second insulating layer 133 may be made of a thermosetting resin, but at least any one thereof may select a mixture of a ferrite powder and a thermosetting resin as a composite.

In the related art, the insulating layer 130 is made of only a thermosetting resin to insulate between the coil layers, such that the magnetic flux in the thin film common mode filter 100 may be offset but it may be difficult to implement the high common mode impedance with the same size while following the tendency of miniaturization of the common mode filter and it is impossible to implement the thin film common mode filter 100 exceeding the conventional common mode impedance with a reduced number of coil turns within a small size; however, in the present invention, the insulating layer is made of the composite of the ferrite powder and the thermosetting resin to overcome the foregoing problem.

The thin film common mode filter 100 according to the exemplary embodiment of the present invention may include the insulating layer 130 that is made of the composite of the ferrite powder and the thermosetting resin that are mixed at a ratio of 1:9 to 6:4. The common mode impedance depending on the ratio of the ferrite powder and the thermosetting resin and the workability of the manufacturing process are shown in the following Table 1 (all of the insulating layers are made of a composite)

TABLE 1

| NO. | vol % (Ferrite powder: PR) | Common mode impedance (Ω) | Workability |
|---|---|---|---|
| 1 | 1:9 | 98.1 | Good |
| 2 | 2:8 | 99.6 | Good |
| 3 | 3:7 | 100.9 | Good |
| 4 | 4:6 | 102.5 | Good |
| 5 | 5:5 | 104.6 | Good |
| 6 | 6:4 | 107.3 | Good |
| 7 | 7:3 | 109.6 | Not permitted |
| 8 | 8:2 | 112.1 | Not permitted |

Compare common mode impedance and workability depending on mixed ratio of ferrite powder (d50=1.0 μm) and bisphenol-based thermosetting resin As can be appreciated from Table 1, as a volume ratio of the ferrite powder to the thermosetting resin is increased, the common mode impedance may be increased, but as the amount of the ferrite powder is increased, the viscosity may be increased, such that the insulating layer 130 made of the composite in which the volume ratio of the ferrite powder is 70% or more may cause a defect of the thin film common mode filter 100, which is not preferable.

The ferrite powder may select a fine particle of 1 μm that is easily mixed with the thermosetting resin and does not have a gap in left and right adjacent regions of a plane coil pattern 120.

Figure 3A:
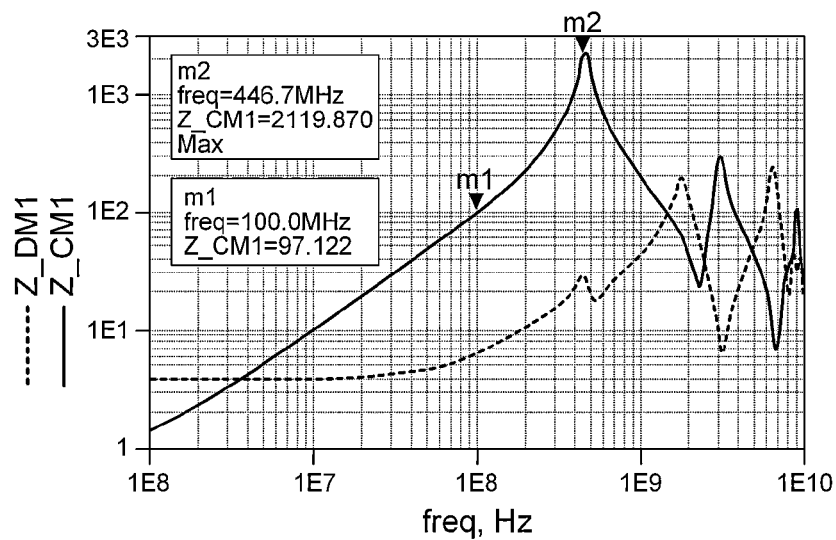
FIGS. 3A and 3B are simulation graphs illustrating an effect of the thin film common mode filter according to the exemplary embodiment of the present invention.
Figure 3B:
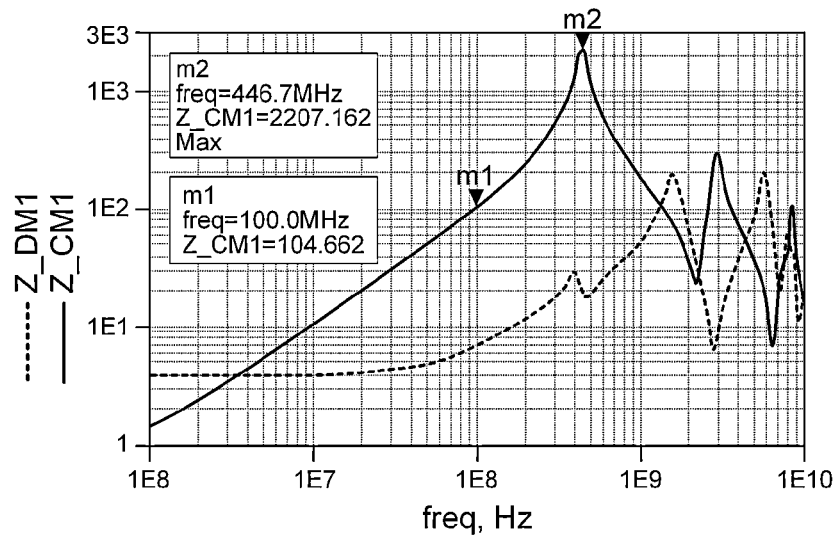

Further, as illustrated in FIG. 3, it can be confirmed that when the passivation layer 131 is made of the composite in which the volume ratio of thermosetting resin and the ferrite powder is 5:5 (FIG. 3B), the impedance capacity is increased from 97.1 to 104.6 (7.7%) than when the passivation layer 131 is made of only the thermosetting resin (FIG. 3A).

Meanwhile, an external electrode 140 is configured in plural and is connected to an end of the coil pattern 120 one-to-one to implement the four-terminal thin film common mode filter 100.

Next, FIG. 4 is a diagram sequentially illustrating a method of manufacturing a thin film common mode filter 100 according to the exemplary embodiment of the present invention and is a diagram illustrating a process of each step viewed from a side.

Figure 4A:
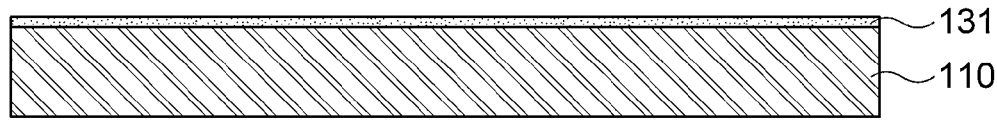
FIGS. 4A-4G show cross-sectional views sequentially illustrating a method of manufacturing a thin film common mode filter according to another exemplary embodiment of the present invention.

First, referring to FIG. 4A, an insulating material is applied to the passivation layer 131 on the magnetic substrate 110 and may be made of the thermosetting resin or the composite of the ferrite powder and the thermosetting resin.

Figure 4B:
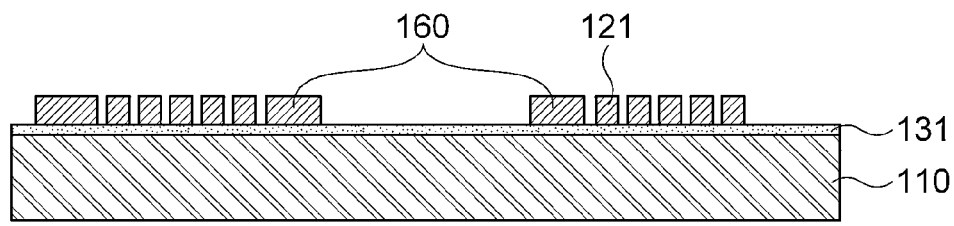

Next, referring to FIG. 4B, the remaining portion except for a portion in which the coil is formed is etched to form the primary coil electrode 121 on the passivation layer 131. A portion in which an internal coil of the common mode filter is not formed may be filled during a process of applying the primary insulating layer 132.

Meanwhile, the primary coil electrode 121 may have a form in which a conducting wire is patterned on the ferrite sheet to form a coil. For example, the primary coil electrode 121 may be configured in such a manner that the ferrite sheet having the coil electrode embedded therein is stacked on the passivation layer 131.

Figure 4C:
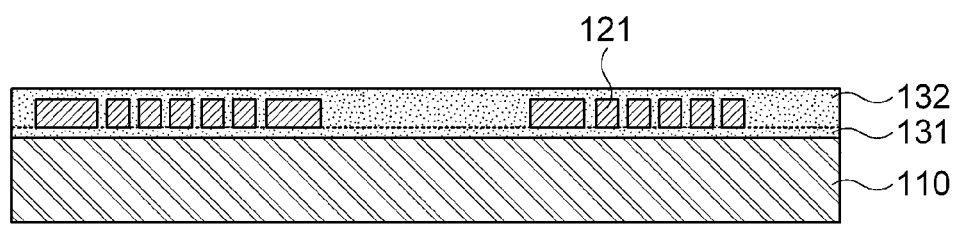
Figure 4D:
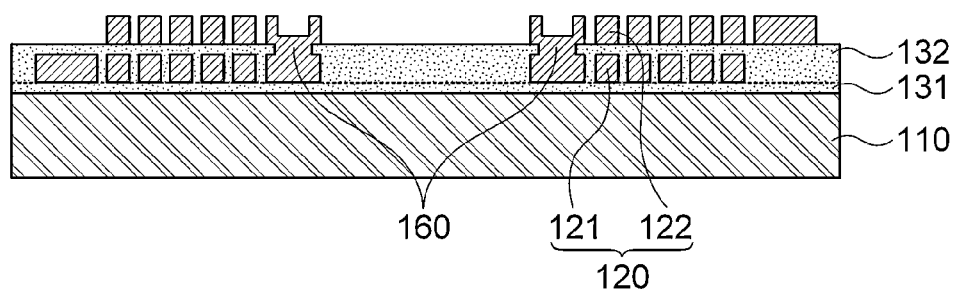
Figure 4E:
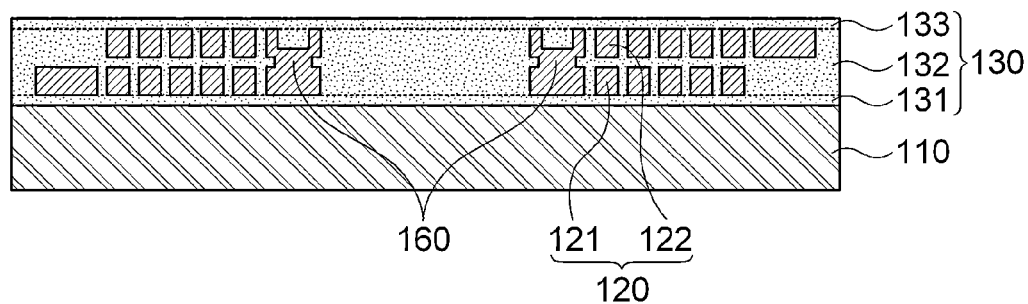

Referring to FIGS. 4C to 4E, the secondary coil electrode 122 is formed by repeatedly performing a process, like the process of forming the primary coil electrode 121, but since the innermost patterns coupling the primary coil electrode 121 with the secondary coil electrode 122 are vertically connected, a process of forming a first via 160 filled with a metal paste having a thickness corresponding to a height of the primary insulating layer 132 may be first performed.

Likewise, the secondary insulating layer 133 may be similarly performed to the process of forming the passivation layer 131 and the primary insulating layer 132. The secondary coil electrode 122 is separate from the magnetic layer 150 and the external electrode 140 to prevent the short between the secondary coil electrode 122 and the external electrode 140 and reducing or minimizing the magnetic flux leaked to the side of the thin film common mode filter 100, thereby improving the performance of the thin film common mode filter 100.

At least any one of the passivation layer 131, the primary insulating layer 132, the secondary insulating layer 133 may be made of the composite of the ferrite powder and the thermosetting resin as the insulating material, all of the insulating layers are made of the composite of the ferrite powder and the thermosetting resin or only a portion thereof is made of the composite of the ferrite powder and the thermosetting resin and the remaining thereof may be made of the insulating material of the thermosetting resin.

Preferably, all of the passivation layer 131, the primary insulating layer 132, and the secondary insulating layer 133 are made of the composite of the ferrite powder and the thermosetting resin and the insulating layer 130 is stacked, such that the common mode filter with the improved common mode impedance may be manufactured.

Figure 4F:
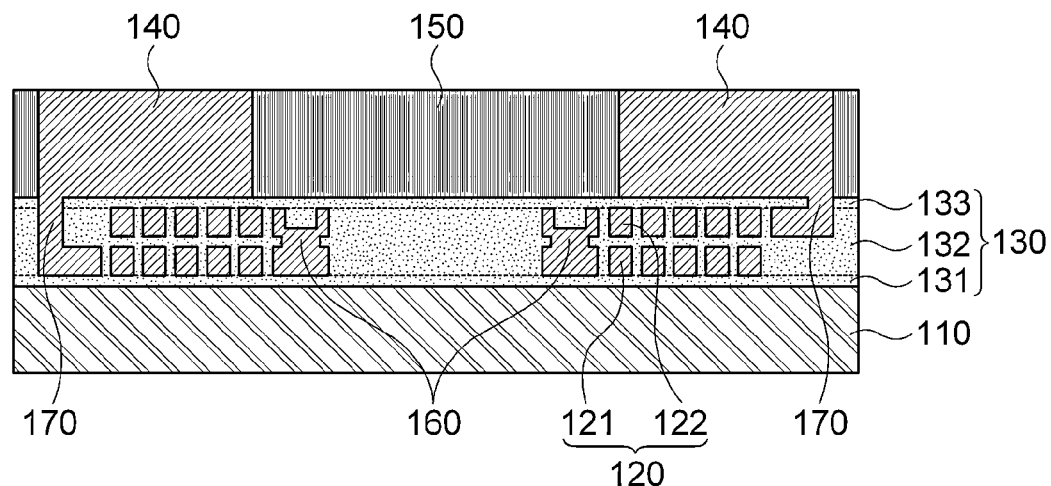

Referring to FIG. 4F, since the external electrode 140 is connected to the end of the coil pattern 120, the process of forming a bump electrode 170 for interconnection may be further provided and the external electrode 140 may be configured in plural to couple each end of the coil pattern 120 one-to-one. Therefore, the external electrodes 140 may each be connected to each end of the primary coil electrode 121 and the secondary coil electrode 122, and thus may be conducted.

When the external electrode 140 is formed, the magnetic layer 150 may be applied around the external electrode 140. In order to increase the permeability and the impedance characteristic of the thin film common mode filter 100, the magnetic layer 150 may be formed by filling predetermined filler on a secondary insulating layer 133. In this case, the filler may be a resin composition containing a magnetic particle.

The magnetic layer 150 needs to be filled to a height corresponding to a thickness reaching the top of the external electrode 140 from the upper portion of the secondary insulating layer 133 and satisfy a filler selection standard to prevent the central portion of the thin film common mode filter 100 from being depressed or cracks from occurring.

Figure 4G:
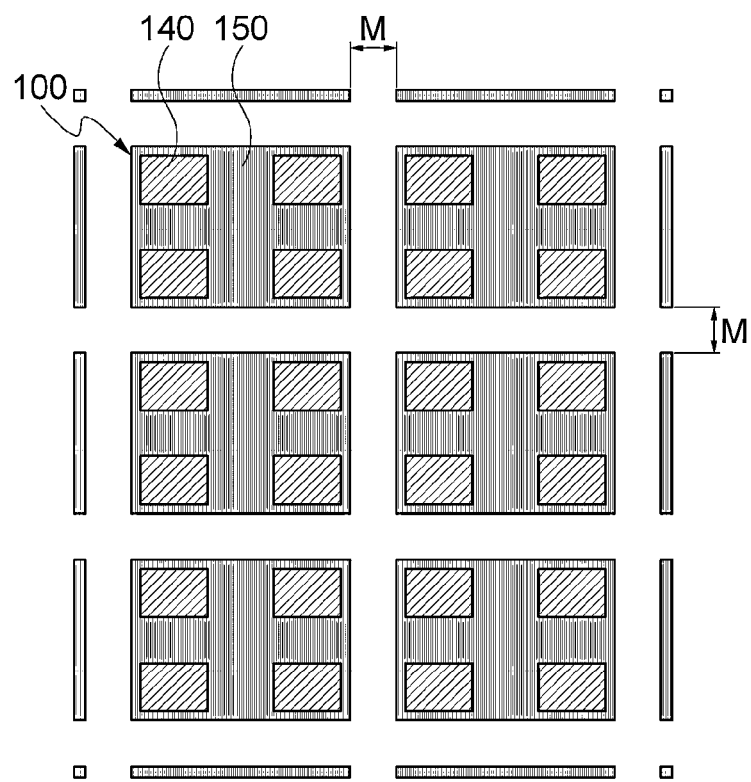

Referring to FIG. 4G, the plurality of thin film common mode filter 100 formed by the process are spaced apart from each other, having a margin part M therebetween and may be partitioned at a predetermined size including a length occupied by the thin film common mode filter 100.

When the margin part is narrow, the unnecessary element defect of the thin film common mode filter 100 may occur during the cutting process and when the margin part is wide, the yield of the produced thin film common mode filter 100 may be degraded, such that the margin part may be selected within a suitable numerical range in consideration of the size of the thin film common mode filter 100.

Further, the cutting process may be performed using a dicing blade having a thickness corresponding to a width of the margin part. When the cutting process is completed, the separated individual thin film common mode filter 100 is completed.

As set forth above, according to the thin film common mode filter and the method of manufacturing the same according to the exemplary embodiment of the present invention, the insulating layer is made of a composite of ferrite powder and thermosetting resin, such that the common mode impedance capacity of the common mode filter having the same size can be increased.

Further, according to the exemplary embodiment of the present invention, the common mode filter can be manufactured at a small size, thereby contributing to the miniaturization of the products in proportion to the reduction in volume of the package.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A thin film common mode filter, comprising:
   a magnetic substrate made of a magnetic ceramic material;
   coil patterns formed on the magnetic substrate;
   a passivation layer formed between the magnetic substrate and coil patterns;
   a primary insulating layer formed between each of the coil patterns and encasing at least a portion of the coil patterns; and
   external electrodes connected with the coil patterns,
   wherein at least one of the passivation layer and the primary insulating layer is made of a composite of ferrite powder and thermosetting resin.

2. The thin film common mode filter according to claim 1, wherein the coil patterns are configured of a primary coil electrode and a secondary coil electrode that are electromagnetically coupled.

3. The thin film common mode filter according to claim 2, wherein the external electrodes are formed in plural and is connected to each end of the primary coil electrode and the secondary coil electrode one-to-one.

4. The thin film common mode filter according to claim 1, further comprising:
   a secondary insulating layer formed on the primary insulating layer,
   wherein the passivation layer, the primary insulating layer, and the secondary insulating layer are made of a composite of the ferrite powder and the thermosetting resin.

5. The thin film common mode filter according to claim 1, wherein the composite is formed of the ferrite powder and the thermosetting resin having a ratio of 1:9 to 6:4.

* * * * *